US008731081B2

(12) United States Patent
Mittal et al.

(10) Patent No.: US 8,731,081 B2
(45) Date of Patent: May 20, 2014

(54) APPARATUS AND METHOD FOR COMBINATORIAL CODING OF SIGNALS

(75) Inventors: Udar Mittal, Hoffman Estates, IL (US); James P. Ashley, Naperville, IL (US)

(73) Assignee: Motorola Mobility LLC, Chicago, IL (US)

( * ) Notice: Subject to any disclaimer, the term of this patent is extended or adjusted under 35 U.S.C. 154(b) by 186 days.

(21) Appl. No.: 13/313,336

(22) Filed: Dec. 7, 2011

(65) Prior Publication Data
US 2013/0148749 A1      Jun. 13, 2013

(51) Int. Cl.
H04L 27/28       (2006.01)

(52) U.S. Cl.
USPC ............ 375/260; 375/240; 375/340; 704/222

(58) Field of Classification Search
USPC ............... 375/240, 240.08, 240.09, 254, 259, 375/260, 262, 265, 340, 341, 346; 704/222, 704/500–504
See application file for complete search history.

(56) References Cited

U.S. PATENT DOCUMENTS

| 6,236,960 | B1 | 5/2001 | Peng et al. |
| 7,461,106 | B2 * | 12/2008 | Mittal et al. ................ 708/200 |
| 7,702,709 | B2 | 4/2010 | Duan |
| 2007/0064826 | A1 * | 3/2007 | El-Gamal et al. ............. 375/260 |
| 2009/0231169 | A1 | 9/2009 | Mittal et al. |
| 2009/0232408 | A1 * | 9/2009 | Meany .......................... 382/246 |
| 2009/0234642 | A1 | 9/2009 | Mittal et al. |
| 2009/0268843 | A1 * | 10/2009 | Kowalski et al. ............. 375/295 |

OTHER PUBLICATIONS

Patent Cooperation Treaty, International Search Report and Written Opinion of the International Searching Authority for International Application No. PCT/US2012/067518, Feb. 19, 2013, 11 pages.
R. Nygaard, D. Haugland, "Compressing ECG Signals by Piecewise Polynomial Approximation," Proc. ICASSP, 1998, all pages.
K. Ichida, T. Kiyono, "Curve Fitting by a One-Pass Method with a Piecewise cubic Polynomial," ACM Transactions on Mathematical Software, vol. 3, No. 2, pp. 164-174, Jun. 1977.
Andrzej Dobrogowski: "Optimal Segmented Compression Characteristic for Speech", IEEE Transactions on Communications, vol. COM-28, No. 2, Feb. 1980, pp. 301-302.

* cited by examiner

*Primary Examiner* — Dac Ha

(57) ABSTRACT

A method and apparatus are for performing one of encoding and decoding a code word that is used to communicate a portion of a signal. For encoding, at least a portion of a code word is encoded from a signal based value using an approximation of a combinatorial function, wherein the signal based value represents one or more aspects of a signal. For decoding, at least a portion of a code word is decoded to a signal based value using an approximation of a combinatorial function, wherein the signal based value represents one or more aspects of a signal. The approximation of the combinatorial function is based on a linear combination of a set of basis functions.

20 Claims, 5 Drawing Sheets

OBTAIN THE MULTIPLIERS $C_k^i$ AND RANGE LIMITS $m_j$ BY SOLVING A CONSTRAINED OPTIMIZATION PROBLEM GIVEN BY MINIMIZING $$\sum_{i=m_j+1}^{m_{j+1}} (G_n(m) - \sum_{k=0}^{l-1} C_k^i \cdot f_i(m))^2 \text{ SUBJECT TO}$$

$$\sum_{i=0}^{l-1} C_k^i \cdot f_i(m) \geq G_n(m) \text{ and } \sum_{i=0}^{l-1} C_k^i \cdot f_i(m) - G_n(m) < \varepsilon$$

FIG. 8

DETERMINE A LOGARITHMIC APPROXIMATION OF A COMBINATORIAL FUNCTION AS $$G'_n(m) = \log_2\left(\sum_{d=1}^{\min(m,n)} F'(n,d) F'(m-1,d-1) 2^d\right)$$

WHEREIN $F'(n,d)$ AND $F'(n-1,d-1)$

ARE DETERMINED AS LOGARITHMIC EXPRESSIONS

AND DETERMINE $\tilde{G}_n(m)$ AS AN APPROXIMATION OF $G'_n(m)$

FIG. 9

APPARATUS AND METHOD FOR COMBINATORIAL CODING OF SIGNALS

FIELD OF THE INVENTION

The present invention relates generally to processor resource efficient digital encoding and decoding.

BACKGROUND

In the last twenty years microprocessor speed increased by several orders of magnitude and Digital Signal Processors (DSPs) became ubiquitous. It became feasible and attractive to transition from analog communication to digital communication. Digital communication offers the major advantage of being able to more efficiently utilize bandwidth and allows for error correcting techniques to be used. Thus by using digital technology one can send more information through a given allocated spectrum space and send the information more reliably. Digital communication can use radio links (wireless) or physical network media (e.g., fiber optics, copper networks).

Digital communication can be used for different types of communication such as speech, audio, image, video or telemetry for example. A digital communication system includes a sending device and a receiving device. In a system capable of two-way communication each device has both sending and receiving circuits. In a digital sending or receiving device there are multiple staged processes through which the signal and resultant data is passed between the stage at which the signal is received at an input (e.g., microphone, camera, sensor) and the stage at which a digitized version of the signal is used to modulate a carrier wave and transmitted. After (1) the signal is received at the input and then digitized, (2) some initial noise filtering may be applied, followed by (3) source encoding and (4) finally channel encoding. At a receive device, the process works in reverse order; channel decoding, source recovery, and then conversion to analog. The present invention as will be described in the succeeding pages can be considered to fall in both the source encoding and source recovery stage.

The main goal of source encoding (and the corresponding channel decoding) is to reduce the bit rate while maintaining perceived quality to the extent possible. Different standards have been developed for different types of media. For example the JPEG standard applies to still images while the IS-127 standard applies to audio. In a concession to practicality, source encoders are often designed with using vector lengths corresponding to a DSP register length or an even multiple of the DSP register length (e.g., 128 bits). Now for each application there is some limit on the allocated channel bandwidth. Based on this limit, the designer of the source encoder/decoder will settle on a certain number of possible codes in view of all the degrees of freedom of each portion of the media being encoded. For example, in the case of speech encoding, there may be a certain audio frame duration established (e.g., 20 msec. during which 160 analog to digital samples are taken). From these samples, certain aspects of the signal are transformed into a vector that represents those aspects for one audio frame. The vector is designed to comprise a certain number of allowed audio pulses in each audio frame, and a certain number of total amplitude quanta to be allocated to the pulses. The choices made by the designer are intended to maximize the perceptual quality while staying within the allocated bandwidth. Because the pulse vector is discrete and quantized one can enumerate the total number of unique vector values into which the samples can be transformed. The total number of unique possibilities for each frame's vector is closely related to the allocated bandwidth because it must be possible to send through the channel during the time interval of the audio frame sufficient information to identify the one unique frame which best corresponds to the audio during that frame.

In some systems, such as those described by 3GPP2 C.S0014-B, published by the 3$^{rd}$ Generation Partnership Project 2, and U.S. Pat. No. 6,236,960 issued to Peng et al., the encoding of the vector into a code word that is ready for channel encoding determines coding pulse offsets of the pulses within the vector that form the code word using values determined from combinatorial functions. These methods are a form of combinatorial coding described as Factorial Pulse Coding (FPC) in US Patent Publication 2009-0234642 by Mittal et al. FPC is described as a technique that can code a vector $x_i$ using a total of M bits, given that $$m = \sum_{i=0}^{n-1} |x_i| \quad (1)$$

and all values of vector $x_i$ are integral valued such that $-m \le x_i \le m$, where m is the total number of unit amplitude pulses, and n is the vector length. The total M bits are used to code N combinations in an efficient manner, such that the following expression, which describes the theoretical minimum number of combinations, holds true:

$$N = \sum_{d=1}^{min(m,n)} F(n,d)D(m,d)2^d \le 2^M. \quad (2)$$

For this equation, F(n,d) are the number of combinations of d non-zero vector elements over n positions given by $$F(n,d) = \frac{n!}{d!(n-d)!}, \quad (3)$$

and D(m,d) are the number of combinations of d non-zero vector elements given m total unit pulses given by:

$$D(m,d) = F(m-1, d-1), \quad (4)$$

and $2^d$ represents the combinations required to describe the polarity (sign) of the d non-zero vector elements. The term min(m, n) allows for the case where the number of unit magnitude pulses m exceeds the vector length n. A method and apparatus for coding and decoding vectors of this form have been fully described in the prior art. Furthermore, a practical implementation of this coding method has been described in 3GPP2 standard C.S0014-B, where the vector length n=54 and the number of unit magnitude pulses m=7 produce an M=35 bit codeword.

While these values of n and m do not cause any unreasonable complexity burden, larger values can quickly cause problems, especially in mobile handheld devices which need to keep memory and computational complexity as low as possible. For example, use of this coding method for some applications (such as audio coding) may require n=144 and m=28, or higher. Under these circumstances, the resource cost associated with producing the combinatorial expression F(n,d) using prior art methods may be too high for practical implementation. US Patent Publication 2009-0234642 by Mittel et al. describes methods to reduce the resources needed to compute combinatorial functions used for both encoding and decoding of vectors of the type described in equation (1), involving a technique of approximation. The technique uses an approximation of a geometric mean of a plurality of numbers to approximate F(n,d).

Although much of the discussion above is with reference to speech and discusses frames, in the more general case different types of signals e.g., image, video, telemetry & audio) may be characterized (in whole or in part) by vectors of the type described in equation (1).

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description, which describes exemplary embodiments of implementable concepts that include the invention. The description is meant to be taken in conjunction with the accompanying drawings in which:

FIGS. 3-9 are flow charts showing steps performed by a combinatorial function generator of FIG. 1 and FIG. 2.

Figure 1:
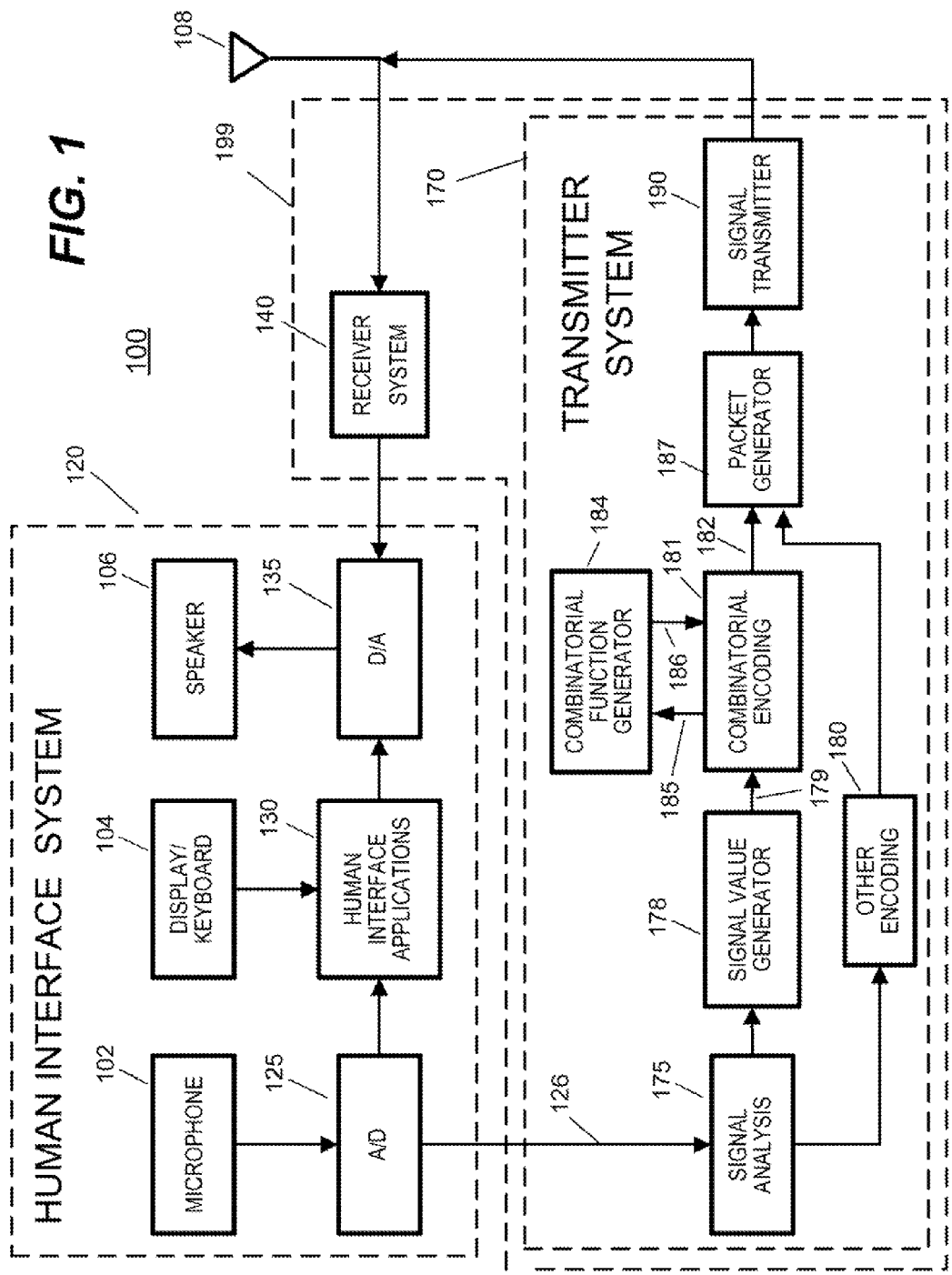
FIG. 1 is a block diagram of an encoder.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

While this invention is susceptible of embodiment in many different forms, there is shown in the drawings and will herein be described in detail specific embodiments, with the understanding that the present disclosure is to be considered as an example of the embodiments and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference may be made in this document to actions that are related to signals (that is, electrical values such as serial or parallel voltage values that are described with or without using the word "signal"). These actions are variously described as "coupling", "receiving", "transmitting", "using", "transferring" "generating", "returning", "conveying" and the like, in various verb forms. These actions are often described in a form in which the signal performs the action or the action acts upon the signal between two entities or functions. For example, "Signal X is coupled from function A to function B", or "entity A transfers signal X to function B". Often times one or the other or both of the entities or functions are not explicitly stated. For example, "Signal X is returned from entity A". In these cases one or both of the entities or functions are often clearly implied by the context. It will be appreciated that the actions may include the storage and retrieval of the signal in a memory that is an entity in addition to the two entities or functions, or a memory that is part of one or the other of the entities or functions, and that the use of the memory may add a delay in the action described. (Such delays would have a duration that is appropriate for the embodiment being described.) Accordingly, the actions described for signals that occur between two entities or functions may imply storage in memory as part of the action. This is particularly true when the entities or functions are embodied within the same device. In some instances one of the entities or functions that is related to the action may be explicitly stated to be, or may be implied to be, a memory. As a consequence, the actions described above may be interpreted in many instances as meaning "storing" or "retrieving" the signal in/from a memory, or as including "storing" or "retrieving" the signal in/from a memory as a first part of the action. Just one example of this includes "transmitting a signal", which may be interpreted in some embodiments to mean "storing a signal", wherein the signal is to be later received by an entity or function that may not be explicitly named.

Embodiments described herein relate to encoding and decoding audio signals. The signals can be speech, other audio such as music, video, images, telemetry, or other signals that are converted to digital information and communicated by wire or wirelessly. The embodiments described herein are related to information bandwidth reduction, with the intent of keeping computational complexity and memory requirements at a manageable level.

Turning now to the drawings, wherein like numerals designate like components, FIG. 1 is a block diagram of a wireless electronic communication device 100, in accordance with certain embodiments. The wireless electronic communication device 100 is representative of many types of wireless communication devices, such as mobile cell phones, mobile personal communication devices, cellular base stations, and personal computers equipped with wireless communication functions. In accordance with some embodiments, wireless electronic communication device 100 comprises a radio system 199, a human interface system 120, and a radio frequency (RF) antenna 108. Although the operations of encoding are described using the example of a wireless electronic communication device, it will be appreciated that the same encoding may be performed in wired electronic communication devices such as fixed network base stations transmitting and receiving wireless signals or fixed network modems transmitting and receiving audio signals.

The human interface system 120 is a system that comprises a processing system and electronic components that support the processing system, such peripheral I/O circuits and power control circuits, as well as electronic components that interface to users, such as a microphone 102, a display/touch keyboard 104, and a speaker 106. The processing system comprises a central processing unit (CPU) and memory. The CPU processes software instructions stored in the memory that primarily relate to human interface aspects of the mobile communication device 100, such as presenting information on the display/keyboard 104 (lists, menus, graphics, etc.) and detecting human entries on a touch surface of the display/keyboard 104. These functions are shown as a set of human interface applications (HIA) 130. The HIA 130 may also receive speech audio from the microphone 102 through the analog/digital (A/D) converter 125, then perform speech recognition of the speech and respond to commands made by speech. The HIA 130 may also send tones such as ring tones to the speaker 106 through digital to analog converter (D/A) 135 The human interface system 120 may comprise other human interface devices not shown in FIG. 1, such as haptic devices and a camera.

The radio system 199 is a system that comprises a processing system and electronic components that support the processing system, such peripheral I/O circuits and power control circuits, as well as electronic components that interface to the antenna, such as RF amplifiers and mixers. The processing system comprises a central processing unit (CPU) and memory. The CPU processes software instructions stored in the memory that primarily relate to radio interface aspects of the mobile communication device 100, such as transmitting digitized signals that have been encoded to data packets (shown as transmitter system 170) and receiving data packets that are decoded to digitized signals (shown as receiver system 140). But for the antenna 108 and certain radio frequency interface portions of receiver system 140 and transmitter system 170 (not explicitly shown in FIG. 1), the wireless electronic communication device 100 would also represent many wired communication devices such as cable nodes or modems. Some embodiments that follow are a personal communication device.

The receiver system 140 is coupled to the antenna 108. The antenna 108 intercepts radio frequency (RF) signals that may include a channel having a digitally encoded signal. The intercepted signal is coupled to the receiver system 140, which decodes the signal and couples a recovered digital signal in these embodiments to a human interface system 120, which converts it to an analog signal to drive a speaker. In other embodiments, the recovered digital signal may be used to present an image or video on a display of the human interface system 120. The transmitter system 170 accepts the digitized signal 126 from the human interface system 120, which may be for example, a digitized speech signal, digitized music signal, digitized image signal, or digitized video signal, which may be coupled from the receiver system 140, stored in the wireless electronic communication device 100, or sourced from an electronic device (not shown) coupled to the electronic communication device 100. The transmitter system 170 analyzes and encodes the digitized signal 126 into digital packets that are transmitted on an RF channel by antenna 108.

The transmitter system 170 comprises a signal analysis function 175 that in accordance with some embodiments analyzes the digitized signal 126 when it is a speech signal, on a 20 msec frame basis for such aspects as average amplitude, average pitch, prediction of aspects of a next frame, spectral components, etc. Certain aspects of the signal may be selected during coding system design as being good candidates for conversion into signal based value that is a pulse vector. In some embodiments, these aspects are those described in 3GPP2 C.S0014-B. The transmitter system 170 further comprises a signal value generator 178 that may comprise any number of encoding paradigms including, but not limited to, Code-Excited Linear Prediction (CELP) speech coding as described by Peng, et. al, transform domain coding for audio, images and video including Discrete Fourier Transform (DFT), Discrete Cosine Transform (DCT), and Modified Discrete Cosine Transform (MDCT) based methods, wavelet based transform coding, direct time domain pulse code modulation (PCM), differential PCM, adaptive differential PCM (ADPCM), or any one of a family of sub-band coding techniques that are well known in the art. Many signal based values of the forms given above may be advantageously processed in accordance with the present invention. An example was described above for 3GPP2, which describes a signal based value that is a 54 position pulse vector having 7 pulses, each having a sign. Another example would be an audio music signal analyzer that may use a pulse vector having 144 positions and 28 pulses. Such an application is described in "Low Complexity Factorial Pulse Coding of MDCT Coefficients Using Approximation of Combinatorial Functions" by Udar Mittal et al., pp. I-289 to I-292 of ICASSP 2007. In some embodiments, combinatorial functions are used for encoding selected aspects of the signal, wherein the selected aspects are not converted to pulse vectors.

The selected aspects of the signal 126 are coupled by signal analysis function 175 to signal value generator 178, which converts those aspects to a signal based value 179 that is coupled to a combinatorial encoding function 181. Other aspects of the signal that are encoded without using combinatorial functions are coupled to another encoding function 180. The combinatorial encoding function 181 encodes the signal based value 179 into a bandwidth efficient code word, based on combinatorial functions. The analysis may involve operating upon portions of a pulse vector instead of operating on a full pulse vector, or may include operations that require determining a bit allocation but are not based on pulse vectors. In 3GPP2, combinatorial analysis is used to determine offsets of the pulses within the pulse vector. In U.S. Pat. No. 7,978,101 issued to Mittal, the most significant bits from combinatorial function encoders are combined using arithmetic coding to achieve more efficient bandwidth. In this example, the largest number of pulses for a coding a pulse vector of a given length into a code word of a given length needs to be determined, which requires the calculation of a combinatorial function. Since the real time calculation of combinatorial functions is not practical in some electronic communication devices having limited processing resources (such as some cell phones), a combinatorial function generator 184 may be used in conjunction with the combinatorial coding function 181 to generate code words. The combinatorial encoding function 181 performs operations using the signal based values 179. The operations require the calculation of combinatorial functions that involve factorials. For these operations, characteristics 185 of the signal based values 179, for example, characteristics such as a length (n) of a signal vector or codeword or of a portion thereof, or a number of pulses (m) used for coding (e.g., a portion of a signal vector may be coded using pulses and, in such an instance, a characteristic may be a number of pulses used for such coding), or a maximum length (bits) of the codeword used for coding a signal vector, are coupled from the combinatorial encoding function 181 to combinatorial function generator 184, which uses these characteristics 185 to generate an approximation of a combinatorial function 186 (i.e., an approximation of a mathematical formula of the combinatorial variety) based on a linear combination of basis functions. In some embodiments the approximation is a piecewise approximation. That is, the optimization process that determines the approximation is solved for a selected set of values of one of the variables used in the linear combination. The approximation 186 is returned to the combinatorial encoding function 181 and used to generate a code word or portion of a code word 182 that is then coupled to a packet generator 187. The packet generator 187 uses these code words or portions thereof, along with other code words generated by the other encoding function 180 to form packets that are coupled to a signal transmitter 190 for conversion to radio signals that are radiated by antenna 108. The operation of combinatorial function generator 184 is described in more detail with reference to FIG. 3.

Figure 2:
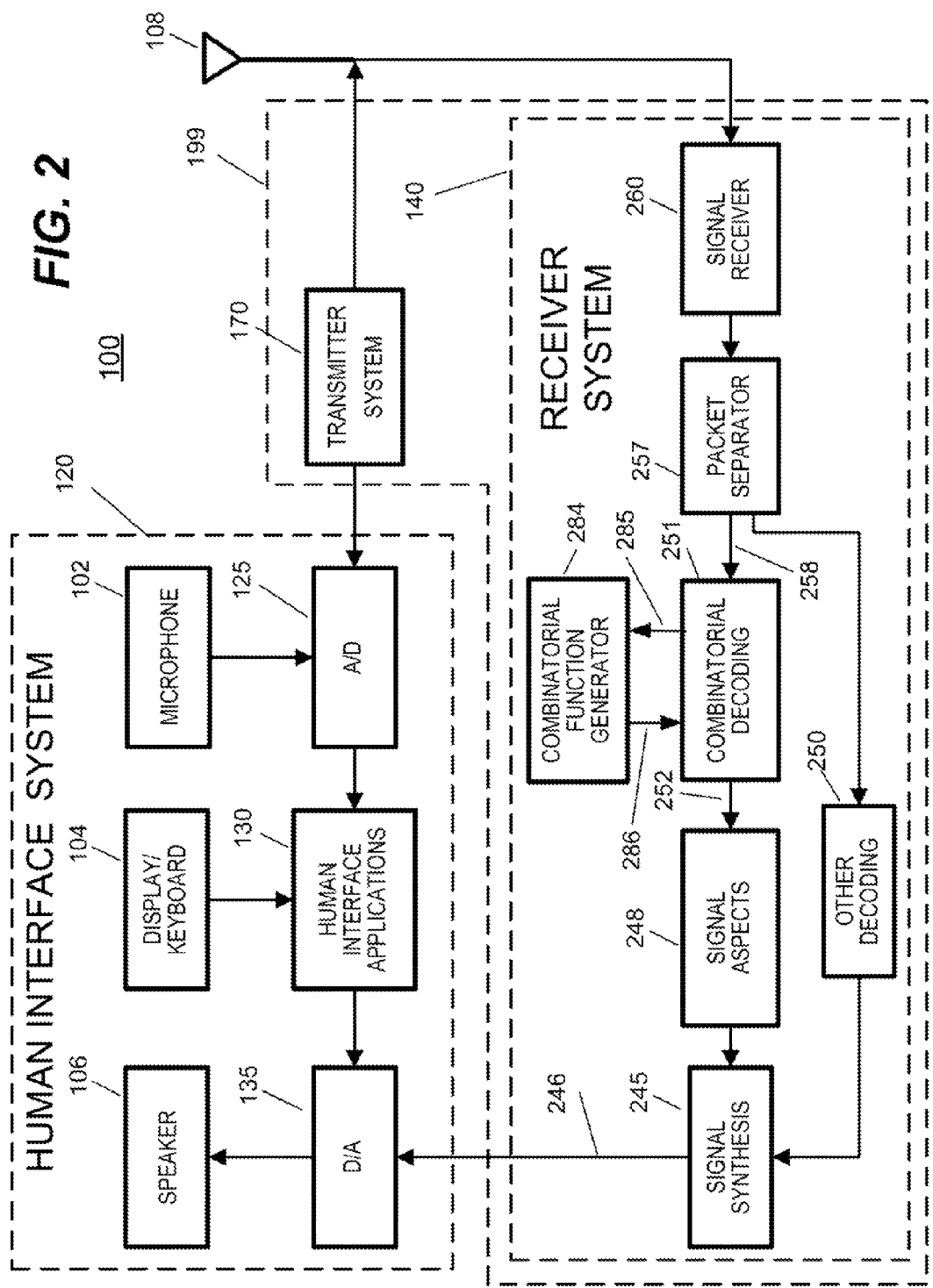
FIG. 2 is a block diagram of a decoder.

Referring to FIG. 2, another block diagram of wireless electronic communication device 100 is shown. Blocks that form receiver system 140 are shown, in accordance with some embodiments. The receiver system 140 is generally designed to be able to decode signals of the type encoded by the transmitter system 170. When the antenna 108 intercepts RF signal energy on a RF channel, a signal receiver 260 demodulates the RF signal energy to generate, in certain embodiments, data packets. The data packets are coupled to a packet separator 257, which determines whether the data packets convey an information signal (for example, speech, audio, image, or video) intended for the specific wireless electronic communication device 100. If so, the wireless electronic communication device 100 sets parameters of the receiver system 140 to decode the data packets according to their type (i.e., speech, music, image, video) and specific parameters (e.g., coding rate). The data packets are separated by packet separator 257 and those portions of the packets that require combinatorial decoding are coupled as code words to a combinatorial decoder function 251 for decoding, while portions that are decoded by other techniques are coupled as code words to another decoding function 250. The combinatorial decoder function 251 performs operations on the code words 258 that require the calculation of combinatorial functions that involve factorials, and for these operations, characteristics 285 determined from each code word 258 or portions of each such code word are coupled to a combinatorial function generator 284, which uses these characteristics 285 to generate a linear approximation 286 of a combinatorial formula (combinatorial function). The approximation 286 is returned to the combinatorial decoder function 251 which uses them to generate a signal based value 252 such as a pulse vector or portion of a pulse vector, or to find pulses based on bit allocations. The signal based value represents an aspect or aspects of the information signal (audio, speech, image, or video) being received. The signal based value 252 is coupled to a signal aspects function 248 which uses the signal based value 252 to generate the aspects represented by the signal based value 252. Meanwhile, code words from the packets are received by other decoder function 250 and are used to generate values related to other aspects of the signal that is being received in the data packets. The aspects derived from the signal based values 252 and the values related to other aspects of the signal are used by a signal synthesis function 245 to generate a digital version of the information signal 246, which is coupled to the human interface system 120 for presentation to a user. The combinatorial function generator 284 may be the combinatorial function generator 184, i.e., it may be a shared function.

In some embodiments, the processing system for the radio system 199 may perform the functions of all of the blocks shown in the transmitter system 170 and receiving system 140, except for some or all functions of the signal transmitter 190 and signal receiver 260 that are performed by RF components. For embodiments of wired electronic communication devices that perform the unique functions described herein, the block diagram may be the same as the block diagrams shown in FIGS. 1 and 2, but for the antenna. For wired electronic communication devices that perform the unique functions described herein and are coupled to audio signals instead of RF signals, the signal transmitter 190 and signal receiver 260 of FIGS. 1 and 2 would be audio signal transmitters and receivers instead of RF signal transmitters and receivers.

Figure 3:
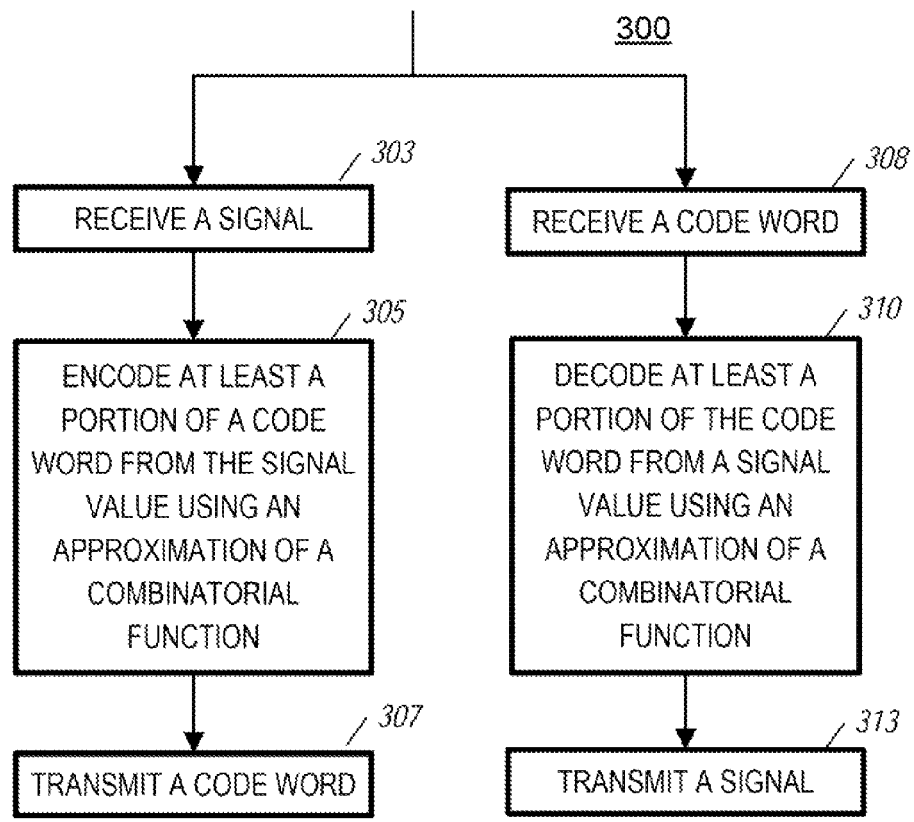

Referring to FIG. 3, some steps of a method 300 for performing one of encoding and decoding a code word are shown, in accordance with certain embodiments. The code word represents one or more aspects of a signal. In one embodiment, at step 303 a signal, such as signal 126 (FIG. 1), is received by, for example, the signal analysis function 175 (FIG. 1) from a signal source, such as the A/D converter 125 (FIG. 1). In step 305 at least a portion of the code word is encoded from a signal based value, such as signal 179 (FIG. 1) using an approximation of a combinatorial function (e.g., FIG. 1, 186). The signal based value (e.g., FIG. 1, 179) represents one or more aspects of the signal 126 (FIG. 1). The approximation is based on a linear combination of a set of basis functions, and may be a piecewise approximation. For example, with reference to equations (12) and (13), the functions f(m) are basis functions and the approximation $\tilde{G}_n(m)$ is obtained from a linear combination of these basis functions. The code word is transmitted at step 307, for example, is coupled by the combinatorial encoding function 181 to packet generator 187 where the code word is formed into a packet, then routed to signal transmitter 190 and is transmitted by the signal transmitter as an RF modulated packet. It will appreciated that the transmission of the code word may be to a memory, wherein the code word is stored until it is read and used by a function, such as the combinatorial encoding function 181 (FIG. 1).

In another embodiment, at step 309, at least a portion of a code word, such as a code word included in an RF signal is received by, for example, the combinatorial decoding function 251 (FIG. 2), from a signal receiver, for example signal receiver 260 (FIG. 2), through packet separator 257 (FIG. 2). It will appreciated that the reception of the code word may be from a memory, wherein the code word has been stored until it is read and used by a function, such as the combinatorial decoding function 251 (FIG. 2) or packet separator 257 (FIG. 2). In step 310 at least a portion of the code word is decoded to a signal based value, such as signal 252 (FIG. 2) using an approximation of a combinatorial function (e.g., FIG. 2, 286). The signal based value 252 (FIG. 2) represents one or more aspects of a signal, for example signal 246 (FIG. 2), which may comprise an information signal such as a video, speech, image or audio signal. The approximation is based on a linear combination of a set of basis functions, and may be a piecewise approximation. At step 313, the signal is transmitted from a signal source, such as signal synthesis function 245 (FIG. 2) which transmits the signal to the D/A function 135 (FIG. 2). In some embodiments, the approximations used in both of the steps 305, 310 may be the same functions, and the combinatorial functions used in both of the alternative steps may be the same functions. It will be further appreciated that the alternative steps may be performed at approximately the same time when performed in a fixed network device that is receiving and transmitting signals simultaneously.

Figure 4:
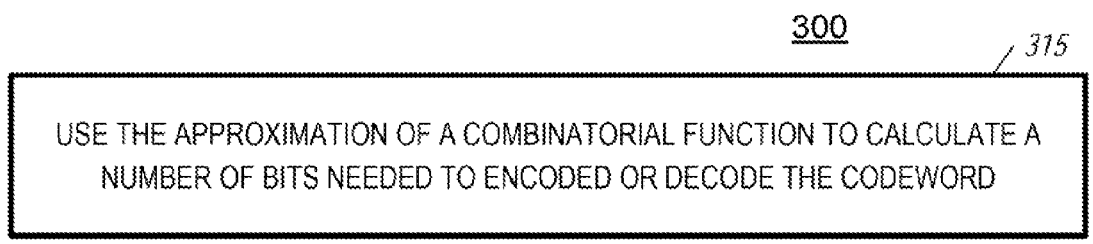

Referring to FIG. 4, a step of the method 300 for performing one of encoding and decoding a code word is shown, in accordance with certain embodiments, including those described with reference to FIG. 3. In step 315, the approximation of the combinatorial function (e.g., FIG. 1, 186, FIG. 2, 286) used in one of steps 305, 310 is used for calculating a number of bits needed for encoding or decoding, respectively, of at least a portion of the code word.

Figure 5:
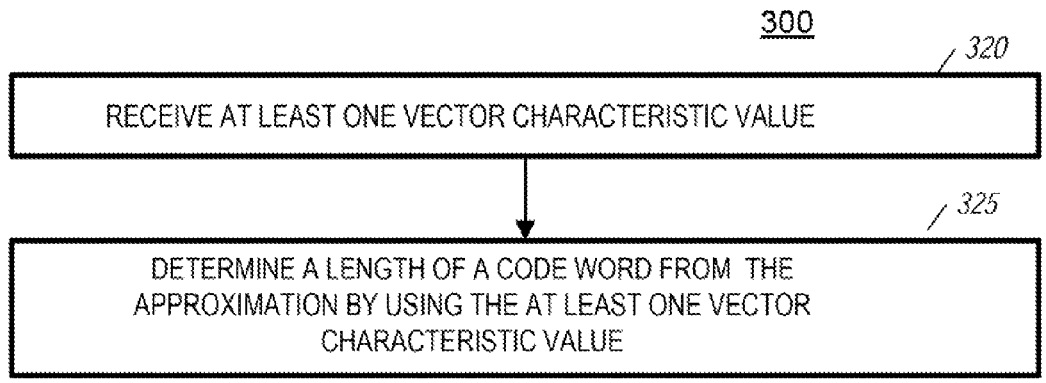

Referring to FIG. 5, some steps of the method 300 for performing one of encoding and decoding a code word are shown, in accordance with certain embodiments, including those described with reference to FIG. 3. With respect to the embodiments depicted in FIG. 5, the signal based value (e.g., FIG. 1, 179, FIG. 2, 252) is a pulse vector. In step 320, at least one vector characteristic value characterizing the pulse vector or a portion thereof is received. The characteristic value may be a pulse count, identified as m, or a length of the codeword or portion thereof, identified as n. At step 325, the piecewise approximation of combinatorial functions uses the characteristic value (one of m and n) and a predefined or known value of the other to determine a length of the codeword or a portion thereof. In some embodiments, both characteristic values are received. The length of the codeword may be referred to as number of bits in the codeword. For some embodiments $$m \equiv \sum_{i=0}^{n-1} |x_i|, \quad (11)$$

wherein each $x_i$ is an integer element of the pulse vector (or a portion of the pulse vector).

Figure 6:
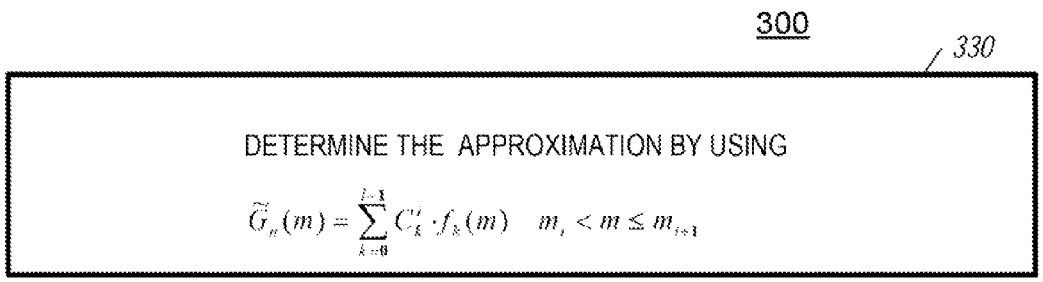

Referring to FIG. 6, a step of the method 300 for performing one of encoding and decoding a code word is shown, in accordance with certain embodiments, including those described with reference to FIG. 5. For some of these embodiments, the pulse vector or a portion thereof has a length, n, that is predetermined, and the approximation of the combinatorial function (e.g., FIG. 1, 186, FIG. 2, 286), $\tilde{G}_n(m)$, is determined at step 330 by $$\tilde{G}_n(m) = \sum_{k=0}^{l-1} C_k^i \cdot f_k(m) \quad m_i < m \le m_{i+1}, \quad (12)$$

wherein each multiplier $C_k^i$ is a constant, each range limit $m_i$ is a positive integer, $m_{i+1} > m_i + 1$, and l is the total quantity of linearly combined functions $f_k(m)$. The linearly combined functions are also referred to as the basis functions.

For some of these embodiments, the length, n, is not predetermined, so that $$\tilde{G}(n, m) = \sum_{k=0}^{l-1} C_k^i \cdot f_k(m) \quad m_i(n) < m \le m_{i+1}(n), \quad (13)$$

wherein each multiplier $C_k^i$ is a constant and each range limit $m_i$ is a positive integer that is a function of n and $m_{i+1} > m_i + 1$.

In some embodiments, some truncated terms of a Taylor series may be useful as the functions $f_k(m)$. In other embodiments at least two of the functions $f_k(m)$ are non-constant functions and at least one of the functions $f_k(m)$ may not be generated by taking a non-negative power of another one of the functions $f_k(m)$. An example of such a set of functions is described below equation (14).

Figure 7:
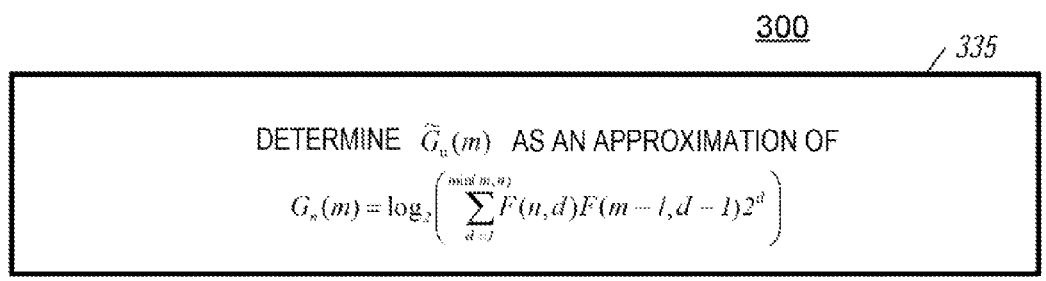

Referring to FIG. 7, a step of the method 300 for performing one of encoding and decoding a code word is shown, in accordance with certain embodiments, including those described with reference to FIG. 6. In some of these embodiments, the approximation of the combinatorial function $\tilde{G}_n(m)$ is determined at step 335 as an approximation of the combinatorial function $$G_n(m) = \log_2 \left( \sum_{d=1}^{\min(m,n)} F(n, d) F(m-1, d-1) 2^d \right), \quad (14)$$

wherein $F(n,d)$ and $F(m-1, d-1)$ are combinatorial functions as given in equation (3).

One useful set of functions $f_k(m)$ used for generating the approximation of equation (14) was found to be the functions $\{1, \log_2(m), m \cdot \log_2(m), m, m^2\}$. It can be seen that some of the functions are not positive powers of others. In some embodiments, the values $\log_2(m)$ and $m \cdot \log_2(m)$ are derived from values stored in a table rather than being calculated each time they are used.

Referring to FIG. 8, a step of the method 300 for performing one of encoding and decoding a code word is shown, in accordance with certain embodiments, including those described with reference to FIG. 6. In some of these embodiments, the multipliers $C_k^i$ and range limits $m_i$ are obtained at step 340 by solving a constrained optimization problem given by minimizing $$\sum_{i=m_i+1}^{m_{i+1}} \left( G_n(m) - \sum_{k=0}^{l-1} C_k^i \cdot f_i(m) \right)^2 \quad (15)$$

subject to $$\sum_{i=0}^{l-1} C_k^i \cdot f_i(m) \ge G_n(m) \text{ and } \sum_{i=0}^{l-1} C_k^i \cdot f_i(m) - G_n(m) < \varepsilon, \quad (16)$$

wherein $\varepsilon$ is an allowable error value. In some embodiments, $\varepsilon$ is 0.015. It will be appreciated that other cost functions and error limits could be used to define the approximation $\tilde{G}_n(m)$. The function $\tilde{G}_n(m)$ can be optimized for all values of m and n that are of interest for coding schemes to be used in a particular electronic device and stored. This can be done offline using conventional optimization techniques that involve iteration in an off line process that may use a substantial amount of time to solve the approximations. Then, only the values for the $C_k$ need be stored for pre-determined ranges of m and n. When performing this optimization, either of m and n can be held constant while the other is optimized. In another approach, one of them can be defined as a function of the other, and the optimization can then be done by varying the other of them to determine the values of m and n.

In an example, $G'_n(m)$ was optimized for all values of n from 6 to 120 and for m from 1 to 560. For each n, the domain m was divided into p=4 pieces given by $S=\{0,m_1,m_2,m_3,m_4\}=\{0, \min(2 \cdot n-4,30), \min(2 \cdot n+40, 120), 360, 560\}$. The values of $C_k^i$ for all values of vector length n's, the interpolation pieces p's, and number of basis functions were computed. In this approach, the domain of one of the characteristics (which are both integral valued characteristics) is divided into two or more pieces such that fewer than all values are represented. Thus, several values of each characteristic are chosen to represent the domain of all values of the characteristic, within a chosen range of the characteristic. In the above example, four values of m are chosen within the chosen range of 1 to 560. Two of the values are a function of n. Then the optimization that determines the values of $C_k^i$ is performed for each of the pieces of the domain over the range of the other characteristic (which is 6 to 120 in this example). This approach is termed herein 'piecewise approximation.' This approach could be extended to dividing the range of both characteristics. In this example of piecewise approximation, only around 120*5*4=2400 memory locations were needed for storage purposes, and it becomes practical for the combinatorial function generators 184, 284 to determine the value of the combinatorial function in a resource limited electronic device. By comparison, the memory requirement for directly storing $G'_n(m)$ for n=\{6:120\} and m=\{1:560\} would be 115*560=64,400 memory locations. The determination of the number of pieces that a domain can be limited to can be determined by experimentation so as to meet the desired approximation difference, $\epsilon$, that is to be achieved.

Referring to FIG. 9, a step of the method 300 for performing one of encoding and decoding a code word is shown, in accordance with certain embodiments, including aspects described with reference to FIG. 6. In these embodiments, a logarithmic based approximation $F'(x, y)$ such as described in US Patent Publication 2009-0234642 by Mittel et al., which is incorporated herein by reference, and "Low Complexity Factorial Pulse Coding of MDCT Coefficients Using Approximation of Combinatorial Functions" by Udar Mittal et al., pp. 1-289 to 1-282 of ICASSP 2007 is used in place of the combinatorial function $$F(x, y) = \frac{x}{y!(x-y)!}.$$

In some of these embodiments $F'(x, y)$ may be determined as $$F'(x,y)=R'(y \cdot P'(2 \cdot x-y+1)-y-Q'(y)) \quad (17)$$

wherein $P'(x) \approx \log_2(x)$, $$Q'(y) \approx \sum_{i=1}^{y} \log_2(i),$$

$R'(k) \approx 2^k$, and where $k=y \cdot P'(2 \cdot x-y+1)-y-Q'(y)$. By these definitions, $P'(x)$ and $Q'(y)$ are values that may be calculated and stored in memory in communication devices that have limited processing resources, and $R'(k) \approx 2^k$ may be calculated as a truncated value in communication devices that have limited processing resources. Then, an approximation of the combinatorial function $G_n(m)$ may be determined using limited processor resources as $$G'_n(m) = \log_2\left(\sum_{d=1}^{\min(m,n)} F'(n, d)F'(n-1, d-1)2^d\right). \quad (18)$$

In some embodiments, the quantity $G_n(m)$ may be the number of bits needed for combinatorial encoding or decoding of a pulse vector of length n using m pulses. The bits may form an entire codeword, or a portion of a codeword that represents the same one or more aspects of the signal that the pulse vector represents. In many situations, the number of bits has been established and it is required to compute how many pulses can be used for encoding so that $G_n(m)$ is less than or equal to the established number of bits. For example U.S. patent publication 2011/0096830 A1 by Ashley et al. describes one such example. This may require computation of $G_n(m)$ for various values of m. In such a situation, it may be preferred to use an approximation $\tilde{G}_n(m)$ (equation 13) of $G'_n(m)$ (equation 18) for computing the combinatorial function $G_n(m)$. In this case it may be said that $\tilde{G}_n(m)$ is an approximation for computing the combinatorial function $G_n(m)$, since $G_n(m)$ is the value that is ultimately approximated. The approximation $\tilde{G}_n(m)$ (equation 13) may be based on a linear combination of a set basis functions, and may be a piecewise approximation.

In embodiments such as those described above, with reference to equations (18) and (19) the multipliers $C_k^i$ and range limits $m_i$ are obtained by solving a constrained optimization problem given by minimizing $$\sum_{i=m_i+1}^{m_{i+1}} \left(G'_n(m) - \sum_{k=0}^{l-1} C_k^i \cdot f_i(m)\right)^2 \quad (19)$$

subject to $$\sum_{i=0}^{l-1} C_k^i \cdot f_i(m) \geq G_n(m) \text{ and } \sum_{i=0}^{l-1} C_k^i \cdot f_i(m) - G_n(m) < \epsilon, \quad (20)$$

wherein $\epsilon$ is an allowable error value. The value for $\epsilon$ in equation 20 is not necessarily the same as the value for $\epsilon$ in equation 16. The function $G'_n(m)$ can be optimized for all values of m and n that are of interest for coding schemes to be used in a particular electronic device and stored. This can be done offline using conventional optimization techniques that involve iteration in an off-line process that may use a substantial amount of time to solve the approximations. Then, only the values for the $C_k$ need be stored for pre-determined ranges of m and n. When performing this optimization, either of m and n can be held constant while the other is optimized. In another approach, one of them can be defined as a function of the other, and the optimization can then be done by varying the other of them to determine the values of m and n.

The processes illustrated in this document, for example (but not limited to) the method steps described in FIGS. 3-9, may be performed using programmed instructions contained on a computer readable medium which may be read by processor of a CPU. A computer readable medium may be any tangible medium capable of storing instructions to be performed by a microprocessor. The medium may be one of or include one or more of a CD disc, DVD disc, magnetic or optical disc, tape, and silicon based removable or non-removable memory. The programming instructions may also be carried in the form of packetized or non-packetized wireline or wireless transmission signals.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method, comprising:

performing one of:

transmitting a code word that includes at least a portion that is encoded from a signal based value using an approximation of a combinatorial function based on a linear combination of a set of basis functions, wherein the signal based value is a pulse vector and represents one or more aspects of a signal that is received; and receiving a code word and decoding at least a portion of the code word to a signal based value using an approximation of a combinatorial function based on a linear combination of basis functions, wherein the signal based value is a pulse vector and represents one or more aspects of a signal, and transmitting the signal;

receiving at least one vector characteristic value; and determining a length of the code word or portion thereof from the approximation of the combinatorial functions by using the at least one vector characteristic value, wherein the at least one characteristic value is one of a pulse count (m) and a vector length (n).

2. The method according to claim 1, wherein the approximation is a piecewise approximation.

3. The method according to claim 1, further comprising using the approximation of the combinatorial function for calculating a number of bits needed for the one of the encoding or decoding of at least a portion of the code word.

4. The method according to claim 1, wherein m and n are related by $$m \equiv \sum_{i=0}^{n-1} |x_i|,$$

and wherein each $x_i$ is an integer element of the pulse vector or a portion of the pulse vector.

5. The method according to claim 4, wherein the pulse vector or a portion thereof has a length given by n, and the method further comprises determining the approximation of the combinatorial function as $$\tilde{G}_n(m) = \sum_{k=0}^{l-1} C_k^i \cdot f_k(m) \quad m_i < m \le m_{i+1},$$

wherein each multiplier $C_k^i$ is a constant, each range limit $m_i$ is a positive integer and $m_{i+1} > m_i + 1$.

6. The method according to claim 5, wherein at least one of the functions $f_k(m)$ is a non-constant function and at least one of the functions $f_k(m)$ is not generated by taking a non-negative power of another one of the functions $f_k(m)$.

7. The method according to claim 5, further comprising determining $\tilde{G}_n(m)$ as an approximation of the combinatorial function $$G_n(m) = \log_2\left(\sum_{d=1}^{\min(m,n)} F(n,d)F(m-1,d-1)2^d\right).$$

8. The method according to claim 5, wherein the functions $f_k(m)$ comprise the functions: $\{1, \log_2(m), m \cdot \log_2(m), m, m^2\}$.

9. The method according to claim 5 further comprising obtaining the multipliers $C_k^i$ and range limits $m_i$ by solving a constrained optimization problem given by minimizing $$\sum_{i=m_i+1}^{m_{i+1}} \left(G_n(m) - \sum_{k=0}^{l-1} C_k^i \cdot f_i(m)\right)^2$$

subject to $$\sum_{i=0}^{l-1} C_k^i \cdot f_i(m) \ge G_n(m) \text{ and } \sum_{i=0}^{l-1} C_k^i \cdot f_i(m) - G_n(m) < \varepsilon,$$

wherein $\varepsilon$ is an allowable error value.

10. The method according to claim 5, further comprising determining a logarithmic approximation of a combinatorial function as $$G'_n(m) = \log_2\left(\sum_{d=1}^{\min(m,n)} F'(n,d)F'(m-1,d-1)2^d\right),$$

wherein $F'(n,d)$ and $F'(n-1,d-1)$ are determined as logarithmic expressions; and determining $\tilde{G}_n(m)$ as an approximation of $G'_n(m)$ by minimizing $$\sum_{i=m_i+1}^{m_{i+1}} \left(G'_n(m) - \sum_{k=0}^{l-1} C_k^i \cdot f_i(m)\right)^2$$

subject to $$\sum_{i=0}^{l-1} C_k^i \cdot f_i(m) \geq G'_n(m) \text{ and } \sum_{i=0}^{l-1} C_k^i \cdot f_i(m) - G'_n(m) < \varepsilon_1,$$

wherein $\varepsilon$ is an allowable error value.

11. An apparatus, comprising:
one of a signal transmitter and a signal receiver; and
a combinatorial function generator coupled to the one of the signal transmitter and signal receiver, wherein
the signal transmitter transmits a code word that includes at least a portion of the code word that is encoded from a signal based value using an approximation of a combinatorial function based on a linear combination of a set of basis functions generated by the combinatorial function generator, wherein the signal based value is a pulse vector and represents one or more aspects of a signal that has been received, and
the signal receiver receives a code word that includes at least a portion of the code word that is decoded to a signal based value using an approximation of a combinatorial function based on a linear combination of a set of basis functions generated by the combinatorial function generator, wherein the signal based value is a pulse vector and represents one or more aspects of a signal that has been transmitted,
wherein the combinatorial signal generator:
receives at least one vector characteristic value, and
determines a length of the code word or portion thereof from the approximation of the combinatorial functions by using the at least one vector characteristic value, wherein the at least one characteristic value is one of a pulse count (m) and a vector length (n).

12. The apparatus according to claim 11, wherein m and n are related by $$m \equiv \sum_{i=0}^{n-1} |x_i|,$$

and wherein each $x_i$ is an integer element of the pulse vector or a portion of the pulse vector.

13. The apparatus according to claim 12, wherein the pulse vector or a portion thereof has a length, n, and the combinatorial signal generator determines the approximation of a combinatorial function as $$\tilde{G}_n(m) = \sum_{k=0}^{l-1} C_k^i \cdot f_k(m) \ m_i < m \leq m_{i+1},$$

wherein each multiplier $C_k^i$ is a constant, each range limit $m_i$ is a positive integer and $m_{i+1} > m_i + 1$.

14. The apparatus according to claim 13, wherein at least one of the functions $f_k(m)$ is a non-constant function and at least one of the functions $f_k(m)$ cannot be generated by taking a non-negative power of another one of the functions $f_k(m)$.

15. The apparatus according to claim 13, wherein the combinatorial signal generator determines $\tilde{G}_n(m)$ as the approximation of the combinatorial function $$G_n(m) = \log_2\left(\sum_{d=1}^{min(m,n)} F(n,d)F(m-1,d-1)2^d\right).$$

16. A non-transitory tangible media that stores programming instructions executed by a processor, the programming instructions comprising:
performing one of:
transmitting a code word that includes at least a portion that is encoded from a signal based value using a piecewise linear approximation of a combinatorial function, wherein the signal based value is a pulse vector and represents one or more aspects of a signal that is received; and
receiving a code word and decoding at least a portion of the code word to a signal based value using a piecewise linear approximation of a combinatorial function, wherein the signal based value is a pulse vector and represents one or more aspects of a signal, and transmitting the signal
receiving at least one vector characteristic value; and
determining a length of the code word or portion thereof from the approximation of the combinatorial functions by using the at least one vector characteristic value, wherein the at least one characteristic value is one of a pulse count (m) and a vector length (n).

17. The tangible media according to claim 16, wherein m and n are related by $$m \equiv \sum_{i=0}^{n-1} |x_i|,$$

and wherein each $x_i$ is an integer element of the pulse vector or a portion of the pulse vector.

18. The tangible media according to claim 17, wherein the pulse vector or a portion thereof has a length, n, and the programming instructions further determine the approximation of a combinatorial function as $$\tilde{G}_n(m) = \sum_{k=0}^{l-1} C_k^i \cdot f_k(m) \ m_i < m \leq m_{i+1},$$

wherein each multiplier $C_k^i$ is a constant, each range limit $m_i$ is a positive integer and $m_{i+1} > m_i + 1$.

19. The tangible media according to claim 18, wherein at least one of the functions $f_k(m)$ is a non-constant function and at least one of the functions $f_k(m)$ cannot be generated by taking a non-negative power of another one of the functions $f_k(m)$.

20. The tangible media according to claim 18, wherein the programming instructions further determine $\tilde{G}_n(m)$ as the approximation of the combinatorial function $$G_n(m) = \log_2\left(\sum_{d=1}^{min(m,n)} F(n,d)F(m-1,d-1)2^d\right).$$

* * * * *